(12) United States Patent
Iwai

(10) Patent No.: US 11,283,481 B2
(45) Date of Patent: Mar. 22, 2022

(54) SPREAD SPECTRUM CLOCK GENERATOR AND SPREAD SPECTRUM CLOCK GENERATION METHOD, PULSE PATTERN GENERATOR AND PULSE PATTERN GENERATION METHOD, AND ERROR RATE MEASURING DEVICE AND ERROR RATE MEASURING METHOD

(71) Applicant: ANRITSU CORPORATION, Kanagawa (JP)

(72) Inventor: Tatsuya Iwai, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 17/332,071

(22) Filed: May 27, 2021

(65) Prior Publication Data
US 2022/0021412 A1    Jan. 20, 2022

(30) Foreign Application Priority Data
Jul. 20, 2020 (JP) .............................. JP2020-123781

(51) Int. Cl.
*H04B 1/7073* (2011.01)

(52) U.S. Cl.
CPC ................................ *H04B 1/7073* (2013.01)

(58) Field of Classification Search
CPC ................................................... H04B 1/7073
USPC ................................................. 375/146, 130
See application file for complete search history.

(56) References Cited

U.S. PATENT DOCUMENTS

| 7,346,095 B1* | 3/2008 | Hattori | H04B 15/02 375/130 |
| 7,656,214 B1* | 2/2010 | Han | H03K 7/06 327/291 |
| 8,389,908 B2* | 3/2013 | Schwerman | H05B 1/02 219/509 |

(Continued)

FOREIGN PATENT DOCUMENTS

| EP | 1473861 A1 * | 11/2004 | ............. H03L 7/087 |
| JP | 6606211 B2 | 11/2019 | |

OTHER PUBLICATIONS

Ky-Anh Tran, "A Spread-Spectrum Clock Generator using Phase Interpolation for EMI reduction", Department of Electrical Engineering and Computer Science MIT, Jun. 2014, pp. 1-125.*

(Continued)

*Primary Examiner* — Jean B Corrielus
(74) *Attorney, Agent, or Firm* — Pearne & Gordon LLP

(57) ABSTRACT

Provided are a spread spectrum clock generator and a spread spectrum clock generation method, a pulse pattern generator and a pulse pattern generation method, and an error rate measuring device and an error rate measuring method capable of performing SSC modulation of any frequency shift according to a standard. Included are a reference signal generator 10 that generates a reference signal, a modulation waveform generator 20 that generates a modulation waveform, a modulation unit 30 that frequency-modulates the reference signal with the modulation waveform to generate an SSC modulated signal, and a modulation control unit 42a capable of arbitrarily controlling the frequency shift of the modulation waveform and a slope of the frequency shift in any time section.

10 Claims, 11 Drawing Sheets

(56) References Cited

U.S. PATENT DOCUMENTS

2008/0032640 A1\* 2/2008 Kawai .................. H04B 1/7136
455/112
2019/0173454 A1\* 6/2019 Jun ....................... G06F 3/0418

OTHER PUBLICATIONS

Yongsam Moon, "A Spread Spectrum Clock Generator for 6Gbps Serial ATA transceiver," Silicon Image Inc., IEICE Electronics Express, vol. 7, No. 13, 2010, pp. 931-935.\*

\* cited by examiner

|  | ~1/4cycle | ~2/4cycle | ~3/4cycle | ~4/4cycle |
|---|---|---|---|---|
| First section | 0 ppm/ns | | | |
| Second section | Variable | | 0.32 ppm/ns | |
| Third section | 0.32 ppm/ns | | | |
| Fourth section | 0.32 ppm/ns | | | |

FIG. 4A

|  | ~200 ns | ~1000 ns | ~1/4cycle |
|---|---|---|---|
| 0~1/4cycle | 7 ppm/ns | 1 ppm/ns | 0.191 ppm/ns |
| 1/4~2/4cycle | 0.191 ppm/ns | | |

FIG. 4B

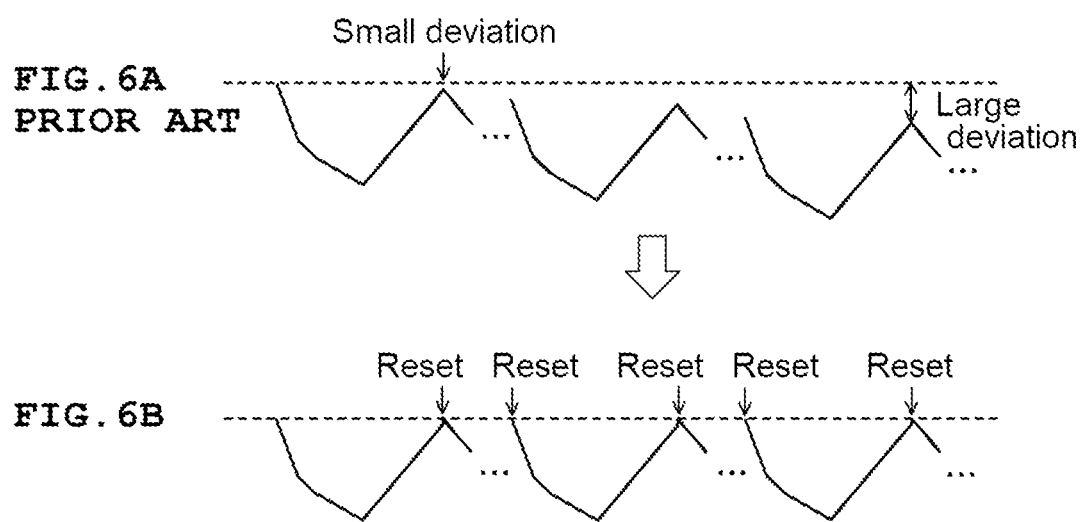

SPREAD SPECTRUM CLOCK GENERATOR AND SPREAD SPECTRUM CLOCK GENERATION METHOD, PULSE PATTERN GENERATOR AND PULSE PATTERN GENERATION METHOD, AND ERROR RATE MEASURING DEVICE AND ERROR RATE MEASURING METHOD

TECHNICAL FIELD

The present invention relates to a spread spectrum clock generator and a spread spectrum clock generation method which spread a spectrum of a reference signal to generate a spread spectrum clock signal, a pulse pattern generator and a pulse pattern generation method, and an error rate measuring device and an error rate measuring method.

BACKGROUND ART

In recent years, with the spread of IoT and cloud computing, communication systems have come to handle enormous amounts of data, and the interfaces of various types of communication equipment constituting the communication systems are becoming faster and serial transmission is progressing. For example, in the High Speed Serial Bus standards such as Universal Serial Bus (USB (registered trademark)) and Peripheral Component Interconnect Express (PCIe (registered trademark)), the initialization of communication between devices and the adjustment of link speed are managed by Link Training and Status State Machine (LTSSM, hereinafter, referred to as "link state management mechanism"). Further, in the above standard, as an electro-magnetic compatibility (EMC) measure, SSC modulation by a spread-spectrum clocking (SSC) that spreads the spectrum of a reference signal is adopted.

Then, as one of the indexes for evaluating the quality of signals in communication equipment, a bit error rate (BER), which is defined as a comparison between the number of received data in which bit errors occur and the total number of received data, has been known. An error rate measuring device for measuring BER in the related art is provided with a function (sequence pattern function) of controlling the link state management mechanism included in a device under test (DUT) and transitioning to a specific state, by switching and outputting a specific pattern defined by the standard from a pulse pattern generator (PPG) at high speed. The pattern for transitioning the state of a DUT is defined by the standard, and the error rate measuring device combines the output order of these patterns by the sequence pattern function and outputs the pattern from the PPG.

FIG. 11 illustrates an example of the state transition of the link state management mechanism, and L0, L0s, L1, L2, Detect, Polling, Configuration, Disabled, Hot Reset, Loopback, and Recovery are defined as the states.

Here, in this type of error rate measuring device, when measuring the error rate of DUT, it is necessary to generate a desired pulse pattern signal and input the pulse pattern signal to the DUT, by using a spread spectrum clock signal of which spectrum is spread (hereinafter, also referred to as "SSC modulated signal") and a data signal. Therefore, there is a demand for an SSC generator and a pulse pattern generator capable of generating an SSC modulated signal by a desired spread method.

Then, inside the SSC generator or pulse pattern generator in the related art, a triangular wave having a predetermined modulation frequency is generated in order to generate an SSC modulated signal, and a reference signal having a predetermined reference frequency is frequency-swept by the triangular wave and frequency-modulated (see, for example, Patent Document 1).

Incidentally, in the USB4 standard, the operation requirement is different between a steady-state such as the Loopback state illustrated in FIG. 11 and a state during training which is a transition state between the steady-states.

FIG. 12A illustrates the waveform of a modulation waveform (triangle wave) for generating a down spread SSC modulated signal in the steady-state, and the vertical axis represents the frequency shift of the reference signal with respect to the reference frequency. In this example, the center frequency of the frequency shift with respect to the reference frequency is lower than the reference frequency by about 2500 ppm. Further, the slope of the frequency shift of the modulation waveform switches between positive and negative in 1/2 cycle of the triangular wave, but the absolute value is always constant.

FIG. 12B illustrates a modulation waveform for generating a down spread SSC modulated signal in a state during training, and the vertical axis represents the frequency shift of the reference signal with respect to the reference frequency. The slope of the frequency shift in the first half of the modulation waveform changes over time unlike the steady-state. Therefore, the center frequency of the frequency shift with respect to the reference frequency is larger (the absolute value is smaller) by $\delta$ ppm than in the steady-state of FIG. 12A. The latter half of the modulation waveform during training is the same as the steady-state triangular wave.

In recent years, many of the various types of communication equipment constituting the communication system do not transmit clock signals for synchronization, but transmit only data signals, and the communication equipment on the receiving side is equipped with a clock recovery circuit that recovers clock signals from the received data signal.

In the state before training, from a state where a pulse pattern signal based on a reference signal without SSC modulation is input to the DUT, when a pulse pattern signal based on a reference signal with SSC modulation equivalent to the steady-state is suddenly input to the DUT, the input frequency fluctuation of the clock recovery circuit in the DUT becomes large. Therefore, due to unlock in the clock recovery circuit, the recovered clock is not output, so that the link training cannot be performed correctly. Therefore, in the standards such as USB4, the reference signal without SSC modulation is first SSC-modulated with less frequency shift than the SSC modulation in the steady-state as illustrated in FIG. 12B, so that it is required to suppress the input frequency fluctuation of the clock recovery circuit in the DUT. After the training is completed and the transition to the steady-state is completed, SSC modulation in the steady-state can be applied to the reference signal.

RELATED ART DOCUMENT

Patent Document

[Patent Document 1] Japanese Patent No. 6606211

DISCLOSURE OF THE INVENTION

Problem that the Invention is to Solve

However, the SSC generator in the related art as disclosed in Patent Document 1 can perform steady-state SSC modulation, but there is a problem that the slope of the frequency shift of the modulation waveform cannot be partially changed, as SSC modulation during training required in the standards such as USB4.

The present invention has been made to solve such a problem in the related art, and an object is to provide a spread spectrum clock generator and a spread spectrum clock generation method, a pulse pattern generator and a pulse pattern generation method, and an error rate measuring device and an error rate measuring method capable of performing SSC modulation of any frequency shift according to a standard.

Means for Solving the Problem

In order to solve the above problems, a spread spectrum clock generator according to the present invention is configured to include a reference signal generator that generates a reference signal; a modulation waveform generator that generates a modulation waveform; a modulation unit that frequency-modulates the reference signal with the modulation waveform to generate a spread spectrum clock signal having any frequency shift and a slope of the frequency shift; and a modulation control unit configured to arbitrarily control the frequency shift of the modulation waveform and the slope of the frequency shift in any time section.

With this configuration, the spread spectrum clock generator according to the present invention can arbitrarily control the frequency shift of the modulation waveform and a slope of the frequency shift in any time section, so that SSC modulation of arbitrary frequency shift corresponding to the standard can be performed by changing the slope of the modulation waveform over time at an appropriate timing. Further, since the spread spectrum clock generator according to the present invention can change the frequency shift of the modulation waveform and a slope of the frequency shift for each time section, it can also be applied to various high-speed serial bus standards to be developed in the future, without being limited to USB4.

Further, in the spread spectrum clock generator according to the present invention, the modulation waveform generator may include a pulse signal output unit that outputs a pulse signal every 1/4 cycle of the modulation waveform, a frequency shift direction information output unit that outputs frequency shift direction information indicating whether the slope of the frequency shift of the modulation waveform is positive or negative at a timing of the pulse signal, a slope absolute value output unit that outputs an absolute value of the slope of the frequency shift of the modulation waveform, a slope output unit that outputs the slope obtained by multiplying the frequency shift direction information by the absolute value, a frequency shift calculation unit that calculates a value obtained by multiplying the slope output from the slope output unit by a predetermined clock cycle as a frequency shift for each predetermined clock cycle, and a cumulative addition circuit that generates the modulation waveform by cumulatively adding the frequency shift calculated by the frequency shift calculation unit for each predetermined clock cycle, and the modulation control unit may control the absolute value output from the slope absolute value output unit.

With this configuration, since the spread spectrum clock generator according to the present invention switches between positive and negative of the slope of the frequency shift of the modulation waveform at the timing of the pulse signal output every 1/4 cycle of the modulation waveform, it is possible to generate a modulation waveform according to a desired spread method (a spread method of down spread, center spread, or upper spread).

Further, in the spread spectrum clock generator according to the present invention, the cumulative addition circuit may reset a head value of the modulation waveform for each cycle at the timing of the pulse signal to a predetermined value.

With this configuration, the spread spectrum clock generator according to the present invention resets the head value of the modulation waveform for each cycle to a predetermined value. Therefore, in the cumulative addition process of the cumulative addition circuit, it is possible to prevent the center frequency of frequency shift of the modulation waveform from changing due to integration of deviation of the modulation waveform generated in each cycle.

Further, a spread spectrum clock generation method according to the present invention is configured to include a reference signal generation step of generating a reference signal; a modulation waveform generation step of generating a modulation waveform; a modulation step of frequency-modulating the reference signal with the modulation waveform to generate a spread spectrum clock signal having any frequency shift and a slope of the frequency shift; and a modulation control step of arbitrarily controlling the frequency shift of the modulation waveform and the slope of the frequency shift in any time section.

With this configuration, the spread spectrum clock generation method according to the present invention can arbitrarily control the frequency shift of the modulation waveform and a slope of the frequency shift in any time section, so that SSC modulation of arbitrary frequency shift corresponding to the standard can be performed by changing the slope of the modulation waveform over time at an appropriate timing. Further, since the spread spectrum clock generation method according to the present invention can change the frequency shift of the modulation waveform and a slope of the frequency shift for each time section, it can also be applied to various high-speed serial bus standards to be developed in the future, without being limited to USB4.

Further, in the spread spectrum clock generation method according to the present invention, the modulation waveform generation step may include a pulse signal output step of outputting a pulse signal every 1/4 cycle of the modulation waveform, a frequency shift direction information output step of outputting frequency shift direction information indicating whether the slope of the frequency shift of the modulation waveform is positive or negative at a timing of the pulse signal, a slope absolute value output step of outputting an absolute value of the slope of the frequency shift of the modulation waveform, a slope output step of outputting the slope obtained by multiplying the frequency shift direction information by the absolute value, a frequency shift calculation step of calculating a value obtained by multiplying the slope output from the slope output step by a predetermined clock cycle as a frequency shift for each predetermined clock cycle, and a cumulative addition step of generating the modulation waveform by cumulatively adding the frequency shift calculated in the frequency shift calculation step for each predetermined clock cycle, and in the modulation control step, the absolute value output from the slope absolute value output step may be controlled.

With this configuration, since the spread spectrum clock generation method according to the present invention switches between positive and negative of the slope of the frequency shift of the modulation waveform at the timing of the pulse signal output every 1/4 cycle of the modulation waveform, it is possible to generate a modulation waveform according to a desired spread method (a spread method of down spread, center spread, or upper spread).

Further, in the spread spectrum clock generation method according to the present invention, in the cumulative addition step, a head value of the modulation waveform for each cycle at the timing of the pulse signal may be reset to a predetermined value.

With this configuration, the spread spectrum clock generation method according to the present invention resets the head value of the modulation waveform for each cycle to a predetermined value. Therefore, in the cumulative addition process of the cumulative addition circuit, it is possible to prevent the center frequency of frequency shift of the modulation waveform from changing due to integration of deviation of the modulation waveform generated in each cycle.

Further, a pulse pattern generator according to the present invention has a configuration in which the pulse pattern generator generates a pulse pattern signal by using the spread spectrum clock signal generated by any of the above spread spectrum clock generators.

With this configuration, the pulse pattern generator according to the present invention can generate a pulse pattern signal with a desired repeating pattern, from the SSC modulated signal from the spread spectrum clock generator and the data signal input from the outside.

Further, the pulse pattern generation method according to the present invention has a configuration to include a step of generating a pulse pattern signal by using the spread spectrum clock signal generated by any of the above spread spectrum clock generation methods.

With this configuration, the pulse pattern generation method according to the present invention can generate a pulse pattern signal with a desired repeating pattern, from the SSC modulated signal from the spread spectrum clock generator and the data signal input from the outside.

Further, an error rate measuring device according to the present invention is configured to include the above-described pulse pattern generator; and an error rate calculation unit that calculates an error rate of a signal under measurement output from a device under test in response to an input of a test signal for testing the device under test, by comparing the signal under measurement with the test signal.

With this configuration, the error rate measuring device according to the present invention can measure the error rate of the device under test, by using the pulse pattern signal modulated by the SSC modulated signal as a test signal.

Further, the error rate measuring method according to the present invention is configured to include the above-described pulse pattern generation method; and an error rate calculation step of calculating an error rate of a signal under measurement output from a device under test in response to an input of a test signal for testing the device under test, by comparing the signal under measurement with the test signal.

With this configuration, the error rate measuring method according to the present invention can measure the error rate of the device under test by using the pulse pattern signal modulated by the SSC modulated signal as a test signal.

Advantage of the Invention

The present invention is to provide a spread spectrum clock generator and a spread spectrum clock generation method, a pulse pattern generator and a pulse pattern generation method, and an error rate measuring device and an error rate measuring method capable of performing SSC modulation of any frequency shift according to a standard.

BRIEF DESCRIPTION OF THE DRAWINGS

FIG. 4A and FIG. 4B is a table showing an example of an absolute value of the slope of the frequency shift of the modulation waveform for each time section, and FIG. 4B is a table showing an example of an absolute value of the slope of the frequency shift of the modulation waveform in a variable section (second section).

FIG. 5A shows the generation of the modulation waveform for SSC modulation in a first section, and FIG. 5B shows the generation of the modulation waveform for SSC modulation in a second section.

FIG. 6A and FIG. 6B is an explanatory diagram showing an output deviation for each cycle in a cumulative addition circuit in the related art, and FIG. 6B is an explanatory diagram showing a correction process of an output deviation for each cycle in a cumulative addition circuit according to the first embodiment of the present invention.

FIG. 12B is a graph showing a modulation waveform for generating a down spread SSC modulated signal in a state during training.

BEST MODE FOR CARRYING OUT THE INVENTION

Hereinafter, embodiments of a spread spectrum clock generator and a spread spectrum clock generation method, a pulse pattern generator and a pulse pattern generation method, and an error rate measuring device and an error rate measuring method according to the present invention will be described with reference to the drawings. Hereinafter, the USB 4 standard will be described as an example.

First Embodiment

Figure 1:
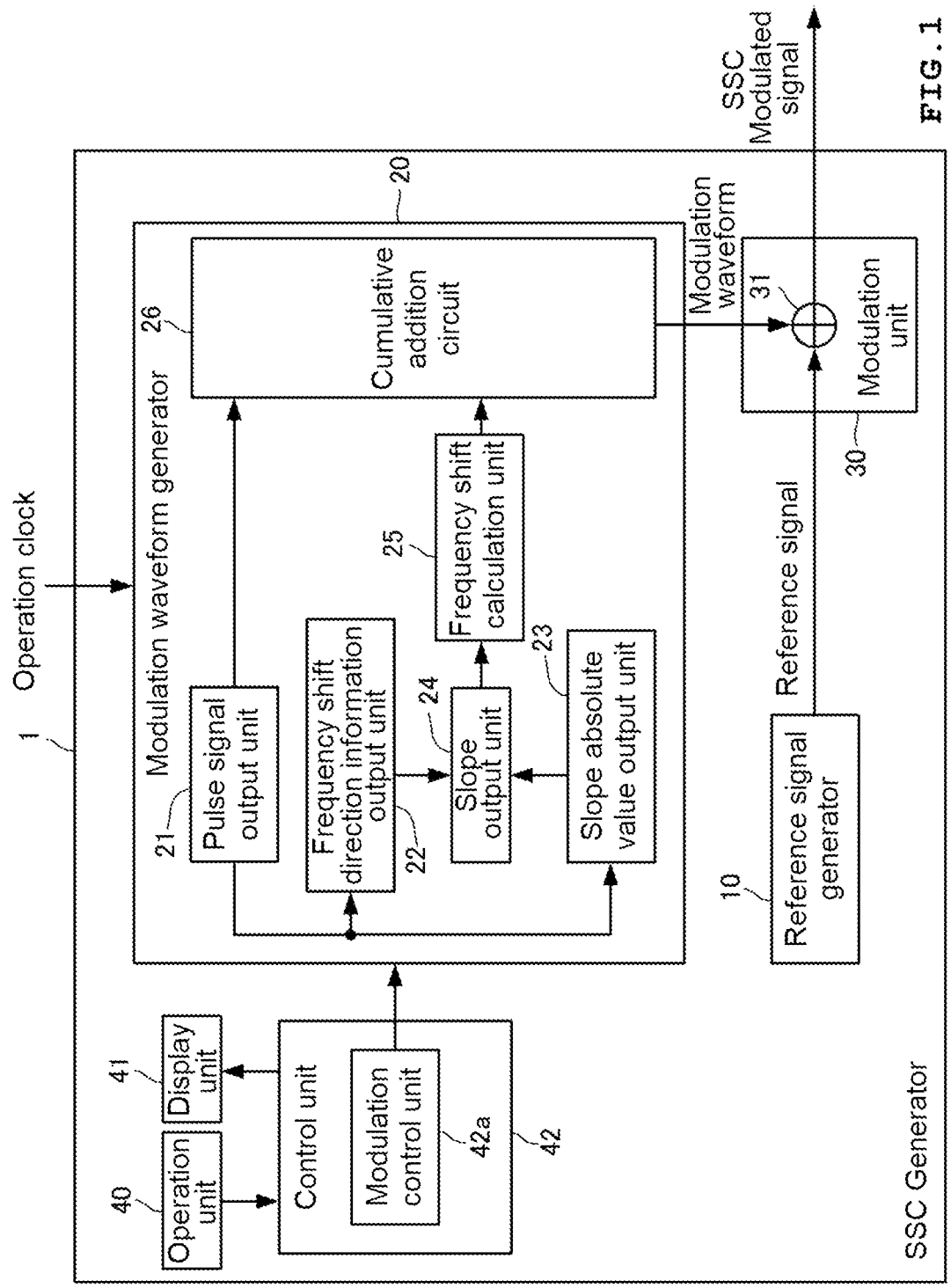
FIG. 1 is a block diagram showing a configuration of an SSC generator according to a first embodiment of the present invention.

As illustrated in FIG. 1, the spread spectrum clock generator (hereinafter, also referred to as "SSC generator") according to the first embodiment of the present invention includes a reference signal generator 10, a modulation waveform generator 20, a modulation unit 30, an operation unit 40, a display unit 41, and a control unit 42.

The reference signal generator 10 generates a reference signal (clock signal) having a reference frequency Fc. The reference frequency Fc is, for example, a frequency of about several GHz.

The modulation waveform generator 20 generates a modulation waveform for performing SSC modulation on a reference signal, and includes a pulse signal output unit 21, a frequency shift direction information output unit 22, a slope absolute value output unit 23, a slope output unit 24, a frequency shift calculation unit 25, and a cumulative addition circuit 26.

The pulse signal output unit 21 outputs a pulse signal as modulation frequency information every 1/4 cycle of the modulation waveform. Here, in the case of USB4, the modulation frequency of the modulation waveform can be set in the range of 30 to 33 kHz.

The frequency shift direction information output unit 22 outputs frequency shift direction information consisting of +1 or −1 value representing positive or negative of the slope of the frequency shift of the modulation waveform at the timing of the pulse signal output from the pulse signal output unit 21, that is, every 1/4 cycle of the modulation waveform. For example, the frequency shift direction information in the case of the down spread of the USB4 is −1, −1, +1, and +1.

The slope absolute value output unit 23 outputs the absolute value of the slope of the frequency shift of the modulation waveform. This slope is determined according to the modulation frequency designated by the operation input to the operation unit 40 by the user and the amplitude of the frequency shift for each arbitrary time section.

The slope output unit 24 outputs a value obtained by multiplying the frequency shift direction information output from the frequency shift direction information output unit 22 by the absolute value of the frequency shift slope of the modulation waveform output from the slope absolute value output unit 23, that is, the slope of the frequency shift of the modulation waveform.

The frequency shift calculation unit 25 calculates a value obtained by multiplying the slope of the frequency shift of the modulation waveform output from the slope output unit 24 by a predetermined clock cycle Tclk, as a frequency shift for each predetermined clock cycle Tclk.

The cumulative addition circuit 26 generates a modulation waveform by cumulatively adding the frequency shift calculated by the frequency shift calculation unit for each predetermined clock cycle Tclk. The pulse signal output unit 21, the frequency shift direction information output unit 22, the slope absolute value output unit 23, the slope output unit 24, the frequency shift calculation unit 25, and the cumulative addition circuit 26 receives an operation clock to give the predetermined clock cycle Tclk from the outside.

Figure 2:
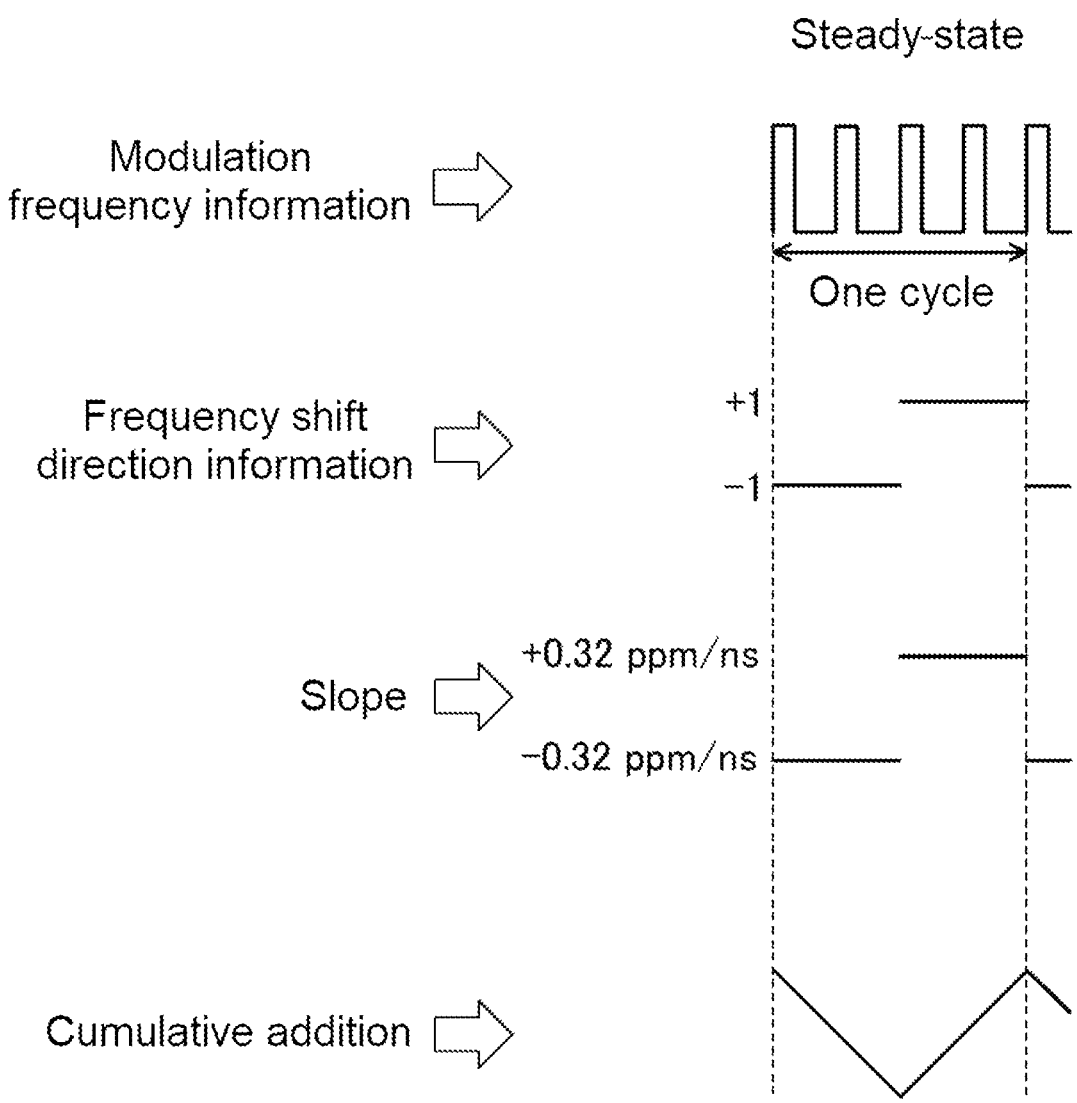
FIG. 2 is an explanatory diagram showing the generation of a triangular wave for SSC modulation in a steady-state by a modulation waveform generator included in the SSC generator according to the first embodiment of the present invention.

FIG. 2 illustrates a procedure for generating a steady-state modulation waveform (triangular wave) by the modulation waveform generator 20. Hereinafter, a case where the modulation waveform generator 20 generates a USB4 down spread SSC modulated signal will be described as an example. Further, the modulation frequency is 32 kHz, and the amplitude of the frequency shift is 5000 ppm. In this case, the absolute value of the slope of the frequency shift is 0.32 ppm/ns.

First, as illustrated in the uppermost stage of FIG. 2, the pulse signal output unit 21 outputs a pulse signal as modulation frequency information every 1/4 cycle of the modulation waveform. Here, one cycle of the modulation waveform is 31250 ns.

Next, as illustrated in the second stage of FIG. 2, the frequency shift direction information output unit 22 outputs a down spread frequency shift direction information that becomes −1, −1, +1, +1 every 1/4 cycle of the modulation waveform.

Next, the slope absolute value output unit 23 outputs 0.32 ppm/ns as the absolute value of the slope of the frequency shift of the modulation waveform. Thus, as illustrated in the third stage of FIG. 2, the slope output unit 24 outputs −0.32 ppm/ns or +0.32 ppm/ns as the slope of the frequency shift of the modulation waveform.

Next, the frequency shift calculation unit 25 outputs −0.32×Tclk or +0.32×Tclk to the cumulative addition circuit 26, as a frequency shift for each predetermined clock cycle Tclk. The cumulative addition circuit 26 generates a modulation waveform (triangular wave) as illustrated in the lowermost stage of FIG. 2, by cumulatively adding −0.32×Tclk or +0.32×Tclk for each predetermined clock cycle Tclk.

Next, the generation of the modulation waveform during training by the modulation waveform generator 20 will be described. For example, the modulation waveform during training required in the USB4 standard is as illustrated in FIG. 3 at a modulation frequency of 32 kHz.

According to the USB4 standard, the frequency shift is −300 to 300 ppm until the start of SSC modulation, 1400 ppm when 200 ns has passed since the start of SSC modulation, and −2200 ppm when 1000 ns has passed since the start of SSC modulation.

Figure 3:
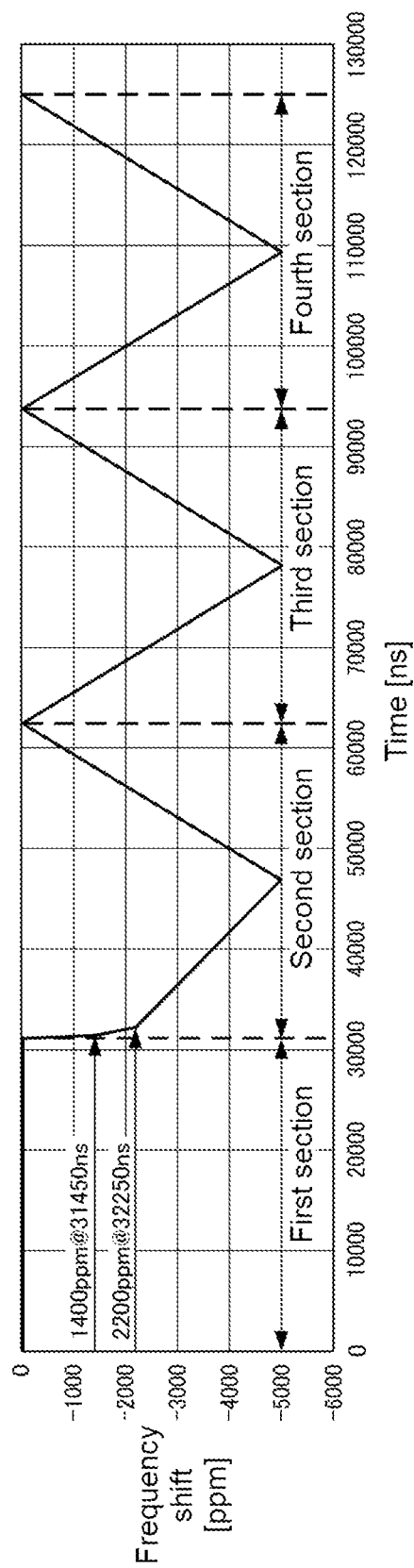
FIG. 3 is a graph showing an example of a modulation waveform generated by the modulation waveform generator included in the SSC generator according to the first embodiment of the present invention.

In the example of FIG. 3, when the time section of 0 to 31250 ns is a first section, the time section of 31250 to 62500 ns is a second section, the time section of 62500 to 93750 ns is a third section, and the time section of 93750 to 125000 ns is a fourth section, the absolute value of the slope of the frequency shift in each time section is given as illustrated in FIG. 4A.

That is, the absolute value of the slope of the frequency shift in the first section is 0 ppm/ns. The absolute value of the slope of the frequency shift in the second section is variable in 0 to 2/4 cycles, and is 0.32 ppm/ns in 2/4 to 4/4 cycles. The absolute value of the slope of the frequency shift in the third section and the fourth section is 0.32 ppm/ns. That is, from the 2/4 cycle of the second section to the fourth section, the same SSC modulation as in the steady-state is performed. During the training, the waveforms from the first section to the fourth section are repeated.

FIG. 4B illustrates an example of the absolute value of the slope of the frequency shift in the 0 to 2/4 cycle of the second section, which is a variable section. That is, the absolute value of the slope of the frequency shift for 0 to 200 ns in the second section is 7 ppm/ns. The absolute value of the slope of the frequency shift for 200 ns to 1000 ns in the second section is 1 ppm/ns. The absolute value of the slope of the frequency shift from 1000 ns to 2/4 cycle in the second section is about 0.191 ppm/ns. Here, 0.191 is a value rounded to the fourth decimal place.

Figures 5A, 5B:
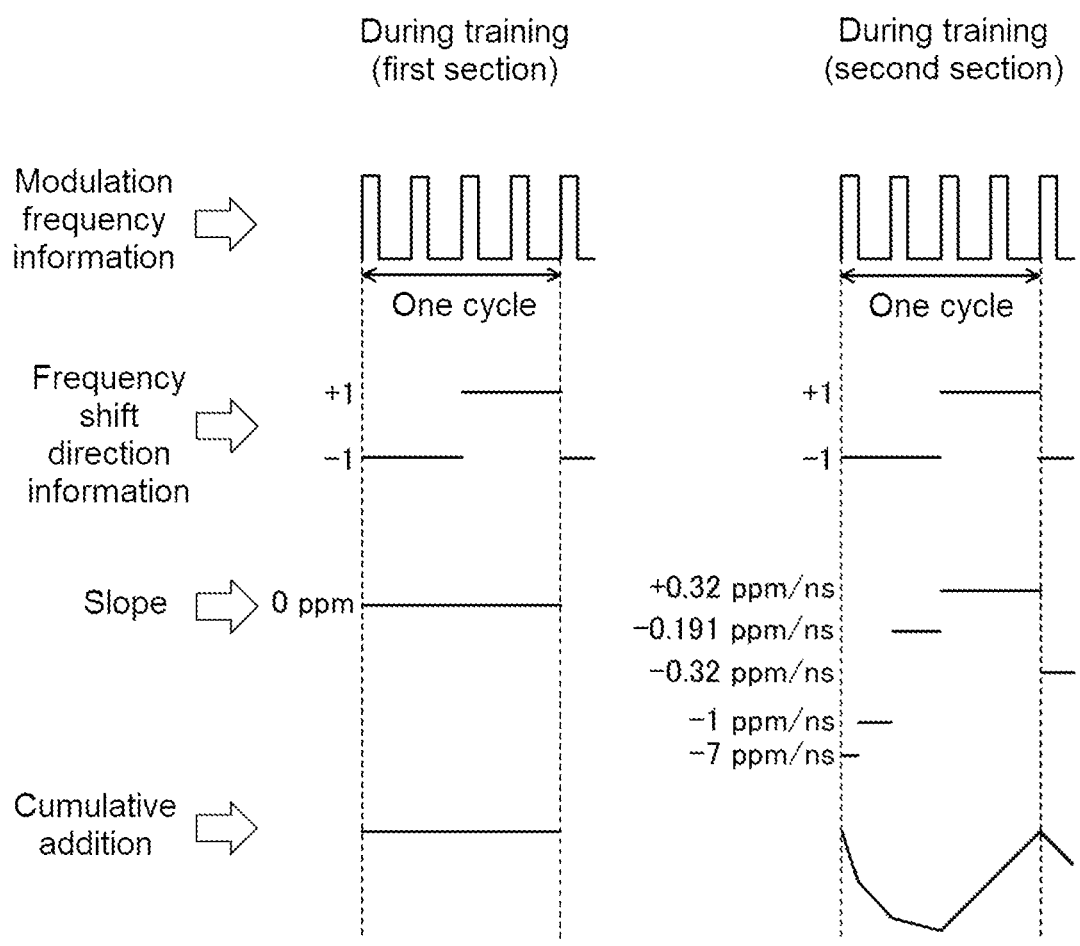
FIG. 5A and FIG. 5B are explanatory diagrams showing the generation of a modulation waveform for SSC modulation during training by the modulation waveform generator included in the SSC generator according to the first embodiment of the present invention.

FIG. 5A illustrates a procedure for generating a modulation waveform in the first section during training by the modulation waveform generator 20.

First, as illustrated in the uppermost stage of FIG. 5A, the pulse signal output unit 21 outputs a pulse signal as modulation frequency information every 1/4 cycle of the modulation waveform.

Next, as illustrated in the second stage of FIG. 5A, the frequency shift direction information output unit 22 outputs a down spread frequency shift direction information that becomes −1, −1, +1, +1 every 1/4 cycle of the modulation waveform.

Next, the slope absolute value output unit 23 outputs 0 ppm/ns as the absolute value of the slope of the frequency shift of the modulation waveform. Thus, as illustrated in the third stage of FIG. 5A, the slope output unit 24 outputs 0 ppm as the slope of the frequency shift of the modulation waveform.

Next, the frequency shift calculation unit 25 outputs 0×Tclk to the cumulative addition circuit 26, as a frequency shift for each predetermined clock cycle Tclk. The cumulative addition circuit 26 generates a modulation waveform as illustrated in the lowermost stage of FIG. 5A, by cumulatively adding 0×Tclk for each predetermined clock cycle Tclk.

FIG. 5B illustrates a procedure for generating a modulation waveform in the second section during training by the modulation waveform generator 20.

First, as illustrated in the uppermost stage of FIG. 5B, the pulse signal output unit 21 outputs a pulse signal as modulation frequency information every 1/4 cycle of the modulation waveform.

Next, as illustrated in the second stage of FIG. 5B, the frequency shift direction information output unit 22 outputs a down spread frequency shift direction information that becomes −1, −1, +1, ±1 every 1/4 cycle of the modulation waveform.

Next, the slope absolute value output unit 23 outputs, as the absolute value of the slope of the frequency shift of the modulation waveform, the value illustrated in FIG. 4, that is, 7 ppm/ns for 0 to 200 ns, 1 ppm/ns for 200 ns to 1000 ns, about 0.191 ppm/ns in 1000 ns to 2/4 cycle, and 0.32 ppm/ns in 2/4 to 4/4 cycle. Thus, as illustrated in the third stage of FIG. 5B, the slope output unit 24 outputs, as the slope of the frequency shift of the modulation waveform, −7 ppm/ns, −1 ppm/ns, about −0.191 ppm/Ns, and 0.32 ppm/ns, respectively.

Next, the frequency shift calculation unit 25 outputs −7×Tclk, −1×Tclk, about −0.191×Tclk, and 0.32 ppm×Tclk to the cumulative addition circuit 26, as a frequency shift for each predetermined clock cycle Tclk. The cumulative addition circuit 26 generates a modulation waveform as illustrated in the lowermost stage of FIG. 5B, by cumulatively adding −7×Tclk, −1×Tclk, about −0.191×Tclk, 0.32 ppm× Tclk for each predetermined clock cycle Tclk. The cumulative addition circuit 26 outputs the same modulation waveform as the steady-state triangular wave, in the third section and the fourth section.

The control unit 42 illustrated in FIG. 1 includes a modulation control unit 42a capable of arbitrarily controlling the frequency shift of the modulation waveform and a slope of the frequency shift in any time section. For example, the modulation control unit 42a arbitrarily controls the absolute value of the slope of the frequency shift of the modulation waveform output from the slope absolute value output unit 23 in any time section. Further, the modulation control unit 42a controls the operation of each of the above-described units constituting the modulation waveform generator 20.

For example, the modulation control unit 42a causes the pulse signal output unit 21 to output a pulse signal corresponding to the modulation frequency designated by the operation input to the operation unit 40 by the user. Further, the modulation control unit 42a outputs frequency shift direction information from the frequency shift direction information output unit 22 at the timing of the pulse signal, according to the spread method (spread method of down spread, center spread, or upper spread) designated by the operation input to the operation unit 40 by the user. Further, the modulation control unit 42a causes the slope absolute value output unit 23 to output the absolute value of the slope of the frequency shift of the modulation waveform for each time section, according to the modulation frequency designated by the operation input to the operation unit 40 by the user and the amplitude of the frequency shift for each arbitrary time section.

Further, the modulation control unit 42a sets the value of the frequency shift at the beginning of the modulation waveform in the cumulative addition circuit 26. As already described, in the requirements of the USB4 standard, the frequency shift in the first section can be arbitrarily set in the range of −300 to 300 ppm, but in the present embodiment, the frequency shift may be set in the range of −1000 to 1000 ppm, for example, without being limited to this range.

Incidentally, in the cumulative addition circuit 26, the output may not correctly return to the original value at the beginning (or end) of each cycle of the modulation waveform, due to the resolution of the operating clock, the limitation of the number of usable bits, and the like. In such a case, as illustrated in FIG. 6A, there is a problem that the deviation from the original value is integrated with the passage of time and the center frequency of the frequency shift changes. Therefore, as illustrated in FIG. 6B, the cumulative addition circuit 26 resets the value of the modulation waveform at the timing of the pulse signal output from the pulse signal output unit 21 for each cycle to a predetermined value. For example, the cumulative addition circuit 26 may reset the value at the beginning (or end) of the modulation waveform for each cycle to a constant predetermined value (for example, 0 ppm) in the range of −1000 to 1000 ppm.

The modulation unit 30 illustrated in FIG. 1 generates an SSC modulated signal by frequency-modulating the reference signal output from the reference signal generator 10 with the modulation waveform output from the cumulative addition circuit 26 of the modulation waveform generator 20, and is configured to include an adder 31.

The adder 31 outputs an SSC modulated signal whose frequency is spread spectrum by adding the reference signal input from the reference signal generator 10 and the modulation waveform input from the modulation waveform generator 20.

The operation unit 40 is for receiving an operation input by the user, and is composed for example, touch panel including a touch sensor for detecting a contact position by a contact operation with the input surface corresponding to the display screen of the display unit 41. When the user touches the position of a specific item displayed on the display screen with a finger, a stylus, or the like, the operation unit 40 recognizes the match between the position detected by the touch sensor on the display screen and the position of the item, and outputs a signal for executing the function assigned to each item to the control unit 42.

Further, the operation unit 40 sets the selection of a spread method, a modulation frequency (for example, 32 kHz), the reference frequency Fc of the reference signal output from the reference signal generator 10, the frequency shift (ratio of modulation to the reference frequency Fc) for each any time section, and the like, as setting information necessary for generating an SSC modulated signal having spread spectrum according to a desired standard.

The display unit 41 is composed of display equipment such as a liquid crystal display or a CRT, and displays operation targets such as a setting item screen related to the SSC generator 1, and buttons, software, pull-down menus, and text boxes for setting various conditions on the setting item screen, based on the display control by the control unit 42.

The control unit 42 is configured with, for example, a microcomputer or a personal computer including a CPU, a ROM, a RAN, a HDD, etc., controls the operation of each of the above-described units constituting the SSC generator 1, and includes the above-described modulation control unit 42a. Further, the control unit 42 can configure at least a part of the modulation waveform generator 20 by software by transferring a predetermined program stored in the ROM or the like to the RAM and executing the program. At least a part of the modulation waveform generator 20 can be configured by a digital circuit such as a Field Programmable Gate Array (FPGA) or an Application Specific Integrated Circuit (ASIC). Alternatively, at least a part of the modulation waveform generator 20 can be configured by appropriately combining a hardware process by a digital circuit and a software process by a predetermined program.

Figure 7:
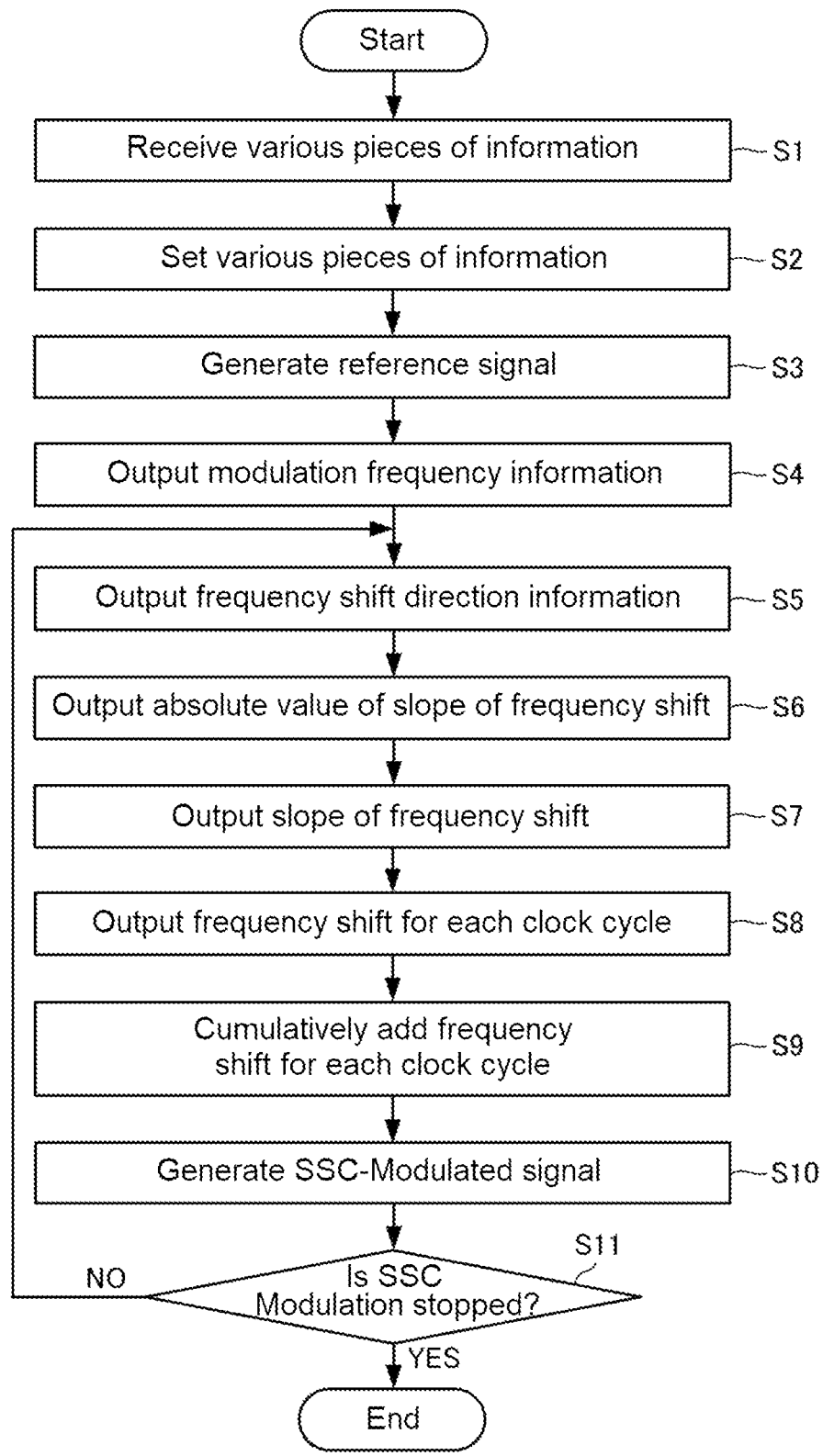
FIG. 7 is a flowchart showing a process of an SSC generation method using the SSC generator according to the first embodiment of the present invention.

Hereinafter, an example of the process of the spread spectrum clock generation method using the SSC generator 1 of the present embodiment will be described with reference to the flowchart of FIG. 7.

First, in response to the operation input to the operation unit 40 by the user, various pieces of information related to SSC modulation, that is, information such as a desired standard, spread method, a reference frequency Fc, a modulation frequency of a modulation waveform, and the amplitude of frequency shift of the modulation waveform for each arbitrary time section are input (step S1).

Next, the modulation control unit 42a sets various pieces of information input by the user in step S1 in the reference signal generator 10 and the modulation waveform generator 20 (modulation control step S2). This modulation control step S2 is a step of making it possible to arbitrarily control the frequency shift of the modulation waveform generated in the process after step S4 and a slope of the frequency shift in any time section. For example, in the modulation control step S2, the absolute value of the slope of the frequency shift of the modulation waveform output from the slope absolute value output step S6, which will be described later, is arbitrarily controlled in any time section.

Next, the reference signal generator 10 generates a reference signal of the reference frequency Fc (reference signal generation step S3).

Next, the pulse signal output unit 21 outputs a pulse signal as modulation frequency information every 1/4 cycle of the modulation waveform of the modulation frequency set by the modulation control unit 42a (pulse signal output step S4).

Next, the frequency shift direction information output unit 22 outputs frequency shift direction information indicating whether the slope of the frequency shift of the modulation waveform is positive or negative every 1/4 cycle of the modulation waveform, at the timing of the pulse signal output from the pulse signal output unit 21 (frequency shift direction information output step S5).

Next, the slope absolute value output unit 23 outputs an absolute value of the slope of the frequency shift of the modulation waveform (slope absolute value output step S6).

Next, the slope output unit 24 outputs the slope of the frequency shift of the modulation waveform, obtained by multiplying the frequency shift direction information output from the frequency shift direction information output unit 22 by the absolute value of the frequency shift slope of the modulation waveform output from the slope absolute value output unit 23 (slope output step S7).

Next, the frequency shift calculation unit 25 calculates a value obtained by multiplying the slope of the frequency shift of the modulation waveform output in the slope output step S7 by a predetermined clock cycle Tclk, as a frequency shift for each predetermined clock cycle Tclk (frequency shift calculation step S8).

Next, the cumulative addition circuit 26 generates a modulation waveform by cumulatively adding the frequency shift calculated in the frequency shift calculation step S8 for each predetermined clock cycle Tclk (cumulative addition step S9). In the cumulative addition step S9, the head value of the modulation waveform at the timing of the pulse signal output from the pulse signal output unit 21 for each cycle is reset to a predetermined value.

Next, the modulation unit 30 frequency-modulates the reference signal output from the reference signal generator 10 with the modulation waveform output from the cumulative addition circuit 26 to generate a signal with SSC modulation (SSC-modulated signal) (modulation step S10).

Next, the control unit 42 determines whether or not an instruction to stop the SSC modulation has been input to the operation unit 40 (step S11). When the instruction to stop the SSC modulation is not input to the operation unit 40, the processes after step S5 are continuously executed. On the other hand, when the instruction to stop SSC modulation is input to the operation unit 40, the control unit 42 ends the series of spread spectrum clock generation process.

In addition, steps S4 to S9 correspond to the modulation waveform generation step of generating the modulation waveform. When the desired standard is USB4, in the modulation waveform generation step, a modulation waveform for generating the down spread SSC modulated signal in the modulation step S10 is generated.

As described above, since the SSC generator according to the present embodiment can arbitrarily control the frequency shift of the modulation waveform and a slope of the frequency shift in any time section, so that SSC modulation of arbitrary frequency shift corresponding to the standard can be performed by changing the slope of the modulation waveform over time at an appropriate timing.

Further, since the SSC generator 1 according to the present embodiment can change the frequency shift of the modulation waveform and a slope of the frequency shift for each time section, it can also be applied to various high-speed serial bus standards to be developed in the future, without being limited to USB4.

Since the SSC generator 1 according to the present embodiment switches between positive and negative of the slope of the frequency shift of the modulation waveform at the timing of the pulse signal output every 1/4 cycle of the modulation waveform, it is possible to generate a modulation waveform according to a desired spread method (a spread method of down spread, center spread, or upper spread).

Further, the SSC generator 1 according to the present embodiment resets the head value of the modulation waveform for each cycle to a predetermined value. Therefore, in the cumulative addition process of the cumulative addition circuit 26, it is possible to prevent the center frequency of frequency shift of the modulation waveform from changing due to integration of deviation of the modulation waveform generated in each cycle.

Second Embodiment

Subsequently, a pulse pattern generator and a pulse pattern generation method, and an error rate measuring device and an error rate measuring method according to a second embodiment of the present invention will be described with reference to the drawings. The same components as those in the first embodiment are designated by the same reference numerals, and the description thereof will be omitted as appropriate. Further, the description of the same operation as that of the first embodiment will be omitted as appropriate.

Figure 8:
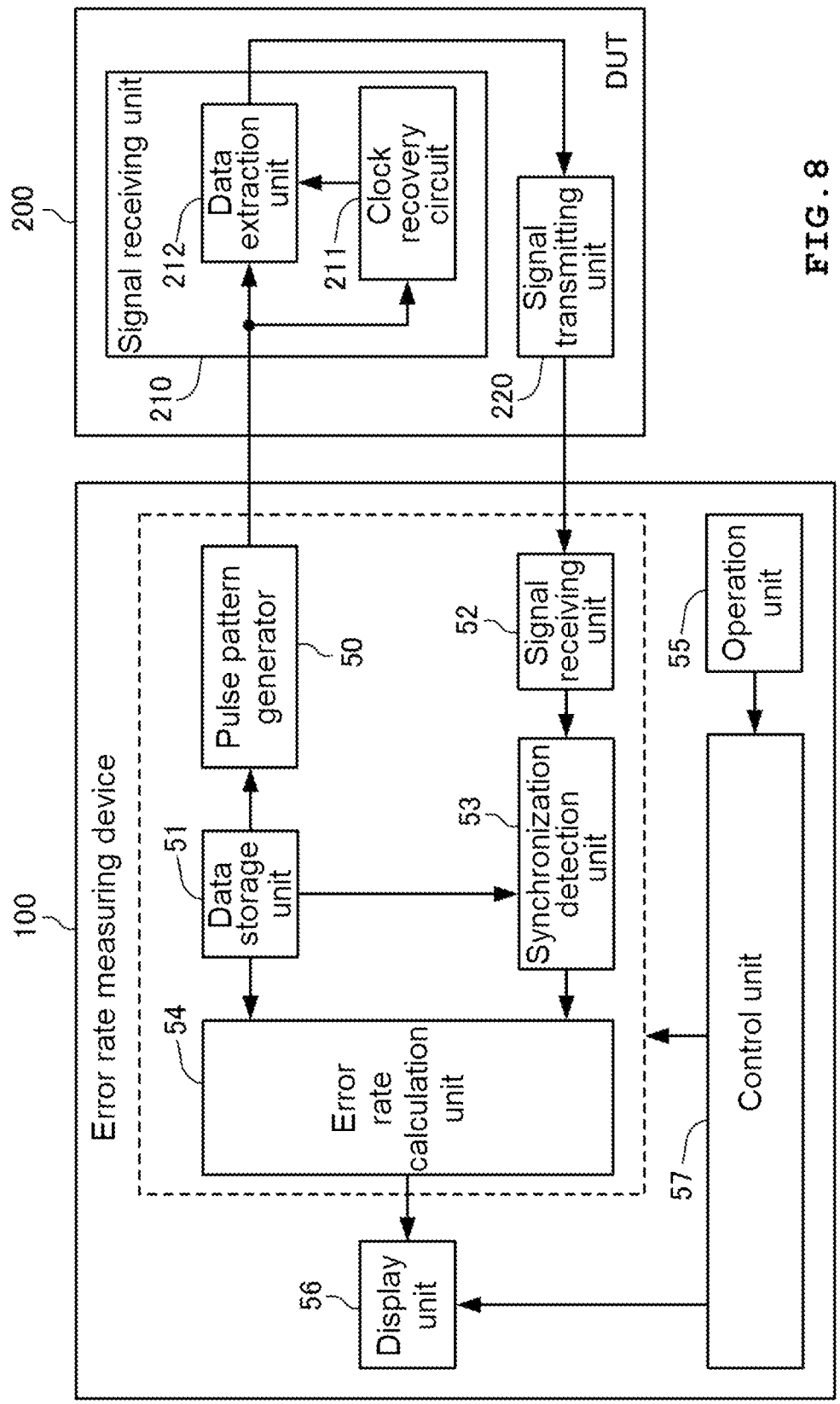
FIG. 8 is a block diagram showing a configuration of an error rate measuring device according to a second embodiment of the present invention.

As illustrated in FIG. 8, the error rate measuring device 100 according to the second embodiment measures the BER of the signal under measurement transmitted from the DUT 200, and includes a pulse pattern generator 50, a data storage unit 51, a signal receiving unit 52, a synchronization detection unit 53, an error rate calculation unit 54, an operation unit 55, a display unit 56, and a control unit 57.

The data storage unit 51 is configured with a memory such as a RAM, and stores in advance a reference data signal (data of low level voltage: "0" and high level voltage: "1").

Figure 9:
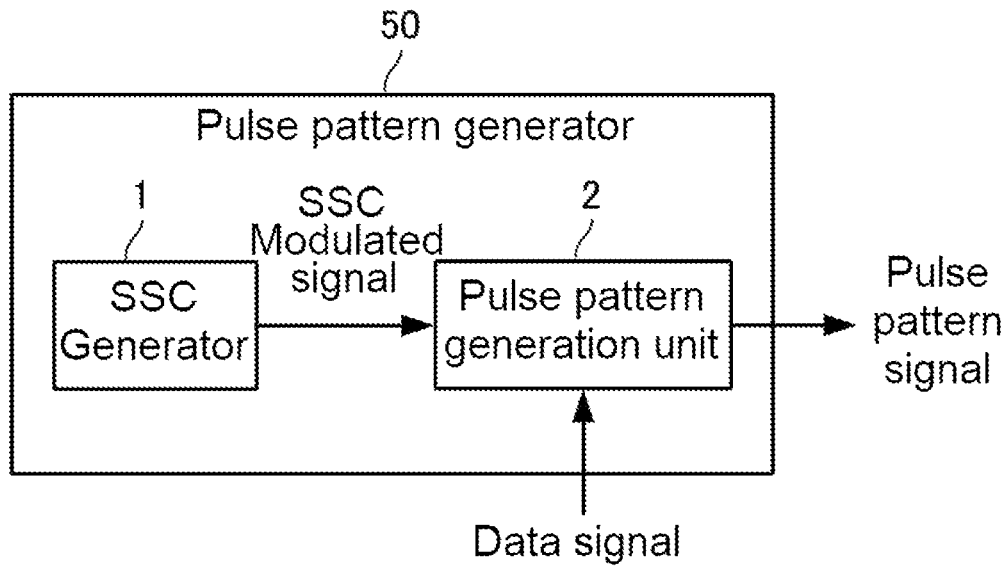
FIG. 9 is a block diagram showing a configuration of a pulse pattern generator included in the error rate measuring device according to the second embodiment of the present invention.

As illustrated in FIG. 9, the pulse pattern generator 50 generates a desired pulse pattern signal by using the spread spectrum SSC modulated signal, and includes the SSC generator 1 of the first embodiment and the pulse pattern generation unit 2.

The pulse pattern generator 50 generates a pulse pattern signal by modulating the data signal read from the data storage unit 51 with the SSC modulated signal generated by the SSC generator 1. Then, the pulse pattern generator 50 transmits the pulse pattern signal generated in this way to the DUT 200 as a test signal. At this time, the DUT 200 receives the pulse pattern signal transmitted from the pulse pattern generator 50, and transmits the received pulse pattern signal as a signal under measurement to the signal receiving unit 52.

The pulse pattern generation unit 2 uses the SSC modulated signal generated by the SSC generator 1 and the data signal input from the data storage unit 51 as inputs, and generates a pulse pattern signal with a desired repeating pattern in which the data signal is modulated with an SSC modulated signal. For example, the pulse pattern generation unit 2 generates a Pseudo-Random Bit Sequence (PRBS) pattern modulated by an SSC modulated signal as pulse pattern signals (test signals) of a known pattern to be input to the DUT 200, a continuous pattern of 0, 1 as a repeating signal, and a programmable pattern consisting of an arbitrary pattern.

The signal receiving unit 52 receives the signal under measurement, transmitted from the DUT 200, and outputs the received signal under measurement, to the synchronization detection unit 53.

The synchronization detection unit 53 synchronizes the data signal read from the data storage unit 51 with the signal under measurement, output from the signal receiving unit 52. Then, the synchronization detection unit 53 outputs the signal under measurement in the synchronized state, to the error rate calculation unit 54.

The error rate calculation unit 54 calculates the error rate of the signal under measurement by comparing the signal under measurement output from the DUT 200 in response to the input of the test signal for testing the DUT 200 with the test signal. For example, the error rate calculation unit 54 detects an error bit of the signal under measurement, by sequentially comparing the signal under measurement, output from the synchronization detection unit 53 with the data signal stored in the data storage unit 51, and calculates the BER of the signal under measurement.

The operation unit 55 is for receiving an operation input by the user, and is configured in the same manner as the operation unit 40 in the first embodiment, and the control unit 57 is notified of the user's contact operation to the input surface corresponding to the display screen of the display unit 56.

The display unit 56 is configured in the same manner as the display unit 41 in the first embodiment, and displays various display contents such as BER of the signal under measurement, calculated by the error rate calculation unit 54, based on the display control by the control unit 57.

The control unit 57 is configured in the same manner as the control unit 42 in the first embodiment, and controls the operation of each of the above units constituting the error rate measuring device 100. Further, the control unit 57 can configure at least a part of the error rate calculation unit 54 by software by transferring a predetermined program stored in the ROM or the like to the RAM and executing the program. At least a part of the error rate calculation unit 54 can be configured by a digital circuit such as FPGA or ASIC. Alternatively, at least a part of the error rate calculation unit 54 can be configured by appropriately combining a hardware process by a digital circuit and a software process by a predetermined program.

The operation unit 55, the display unit 56, and the control unit 57 in the present embodiment may also serve as the operation unit 40, the display unit 41, and the control unit 42 in the first embodiment, respectively.

Figure 11:
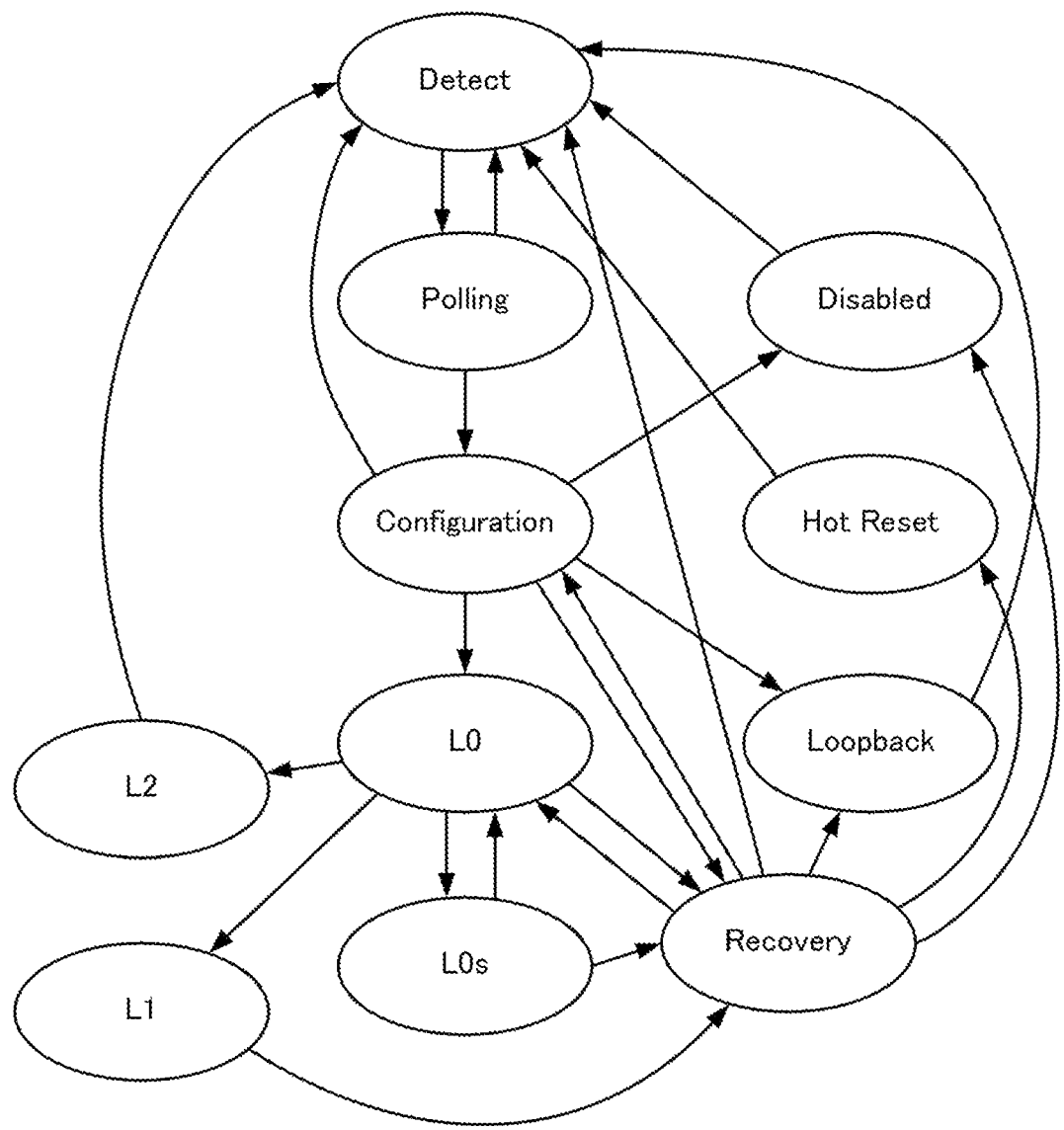
FIG. 11 is a diagram showing a state transition of a link state management mechanism.
Figure 12A:
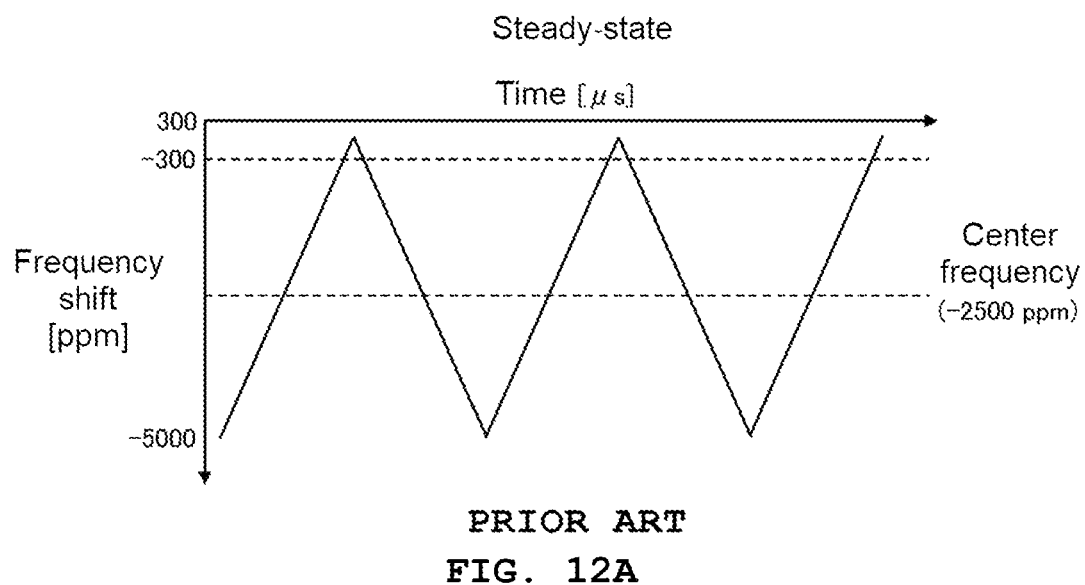
FIG. 12A and FIG. 12B is a graph showing a triangular wave waveform for generating a down spread SSC modulated signal in a steady-state.
Figure 12B:
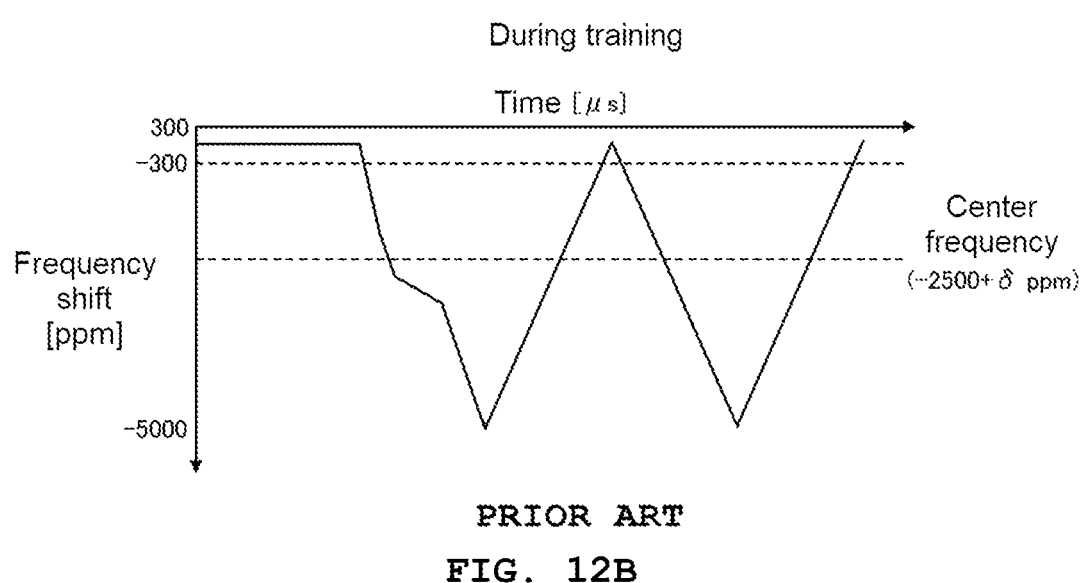

The DUT 200 is equipped with a link state management mechanism, and in a state of transitioning to an arbitrary state as illustrated in FIG. 11, for example, the link state management mechanism outputs (returns) a test signal input from the error rate measuring device 100, as the signal under measurement of the error rate measuring device 100. Examples of the standards supported by the DUT 200 include PCIe Gent to 4, USB3.1 to 4, Common Electrical Interface (CEI), Ethernet (registered trademark), InfiniBand, and the like.

The DUT 200 includes a signal receiving unit 210 and a signal transmitting unit 220. Further, the signal receiving unit 210 includes a clock recovery circuit 211 and a data extraction unit 212.

The clock recovery circuit 211 generates a recovered clock signal from the test signal transmitted from the error rate measuring device 100. The data extraction unit 212 uses the recovered clock signal output from the clock recovery circuit 211 as an operation clock, extracts the data on the test signal input from the error rate measuring device 100, and outputs the extracted data to the signal transmitting unit 220. For example, the data extraction unit 212 has at least one 0/1 determination device, and when the recovered clock signal from the clock recovery circuit 211 is input to each 0/1 determination device, the level of the test signal transmitted from the error rate measuring device 100 can be determined at the timing of the recovered clock signal.

The signal transmitting unit 220 outputs the data on the test signal extracted by the data extraction unit 212 to the error rate measuring device 100 as a signal under measurement.

Figure 10:
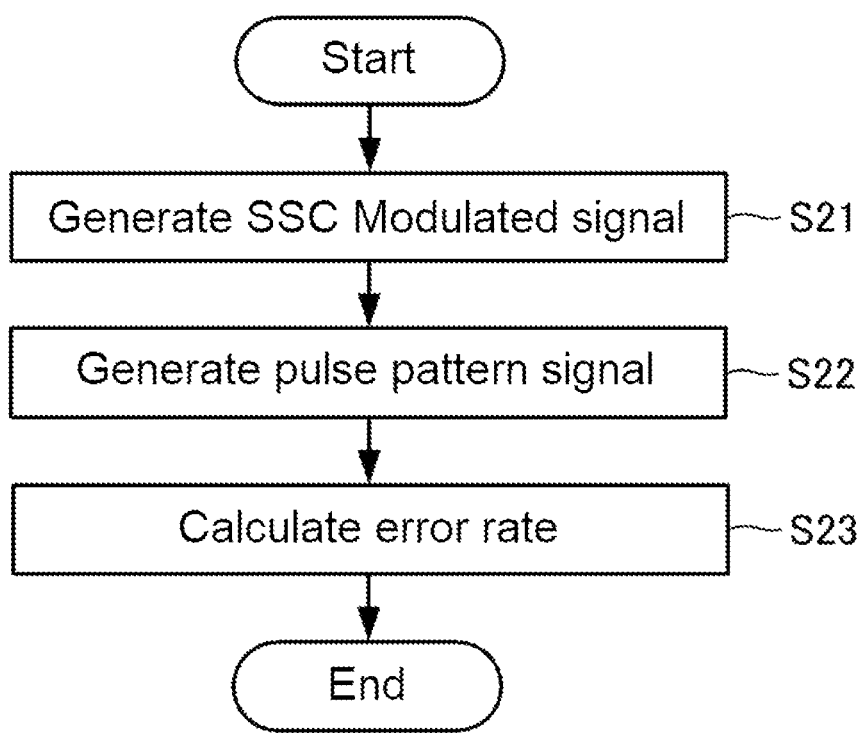
FIG. 10 is a flowchart showing a process of a pulse pattern generation method and an error rate measuring method according to the second embodiment of the present invention.

Hereinafter, an example of the process of the pulse pattern generation method and the error rate measuring method of the present embodiment will be described with reference to the flowchart of FIG. 10.

First, the SSC generator 1 of the pulse pattern generator 50 generates an SSC modulated signal (step S21).

Next, the pulse pattern generation unit 2 of the pulse pattern generator 50 modulates the data signal read from the data storage unit 51 with the SSC modulated signal to generate a pulse pattern signal with a desired repeating pattern (step S22).

Next, the error rate calculation unit 54 calculates the error rate of the signal under measurement by comparing the signal under measurement output from the DUT 200 in response to the input of the test signal for testing the DUT 200 with the test signal (error rate calculation step S23). Here, the test signal is a pulse pattern signal generated in step S22.

As described above, the pulse pattern generator 50 according to the present embodiment can generate a pulse pattern signal with a desired repeating pattern, from the SSC modulated signal from the SSC generator 1 and the data signal input from the data storage unit 51.

Further, the error rate measuring device 100 according to the present embodiment can measure the error rate of the DUT 200, by using the pulse pattern signal modulated by the SSC modulated signal as a test signal.

DESCRIPTION OF REFERENCE NUMERALS AND SIGNS

1 SSC generator
2 Pulse pattern generator
10 Reference signal generator
20 Modulation waveform generator
21 Pulse signal output unit
22 Frequency shift direction information output unit
23 Slope absolute value output unit
24 Slope output unit
25 Frequency shift calculation unit
26 Cumulative addition circuit
30 Modulation unit
42a Modulation control unit
50 Pulse pattern generator
51 Data storage unit
52 Signal receiving unit
53 Synchronization detection unit
54 Error rate calculation unit
100 Error rate measuring device
200 DUT
210 Signal receiving unit
211 Clock recovery circuit
212 Data extraction unit
220 Signal transmitting unit

What is claimed is:

1. A spread spectrum clock generator comprising:
a reference signal generator that generates a reference signal;
a modulation waveform generator that generates a modulation waveform;
a modulation unit that frequency-modulates the reference signal with the modulation waveform to generate a spread spectrum clock signal having a frequency shift and a slope of the frequency shift; and
a modulation control unit configured to arbitrarily control the frequency shift of the modulation waveform and the slope of the frequency shift in a time section.

2. The spread spectrum clock generator according to claim 1, wherein the modulation waveform generator comprises:
a pulse signal output unit that outputs a pulse signal every 1/4 cycle of the modulation waveform,
a frequency shift direction information output unit that outputs frequency shift direction information indicating whether the slope of the frequency shift of the modulation waveform is positive or negative at a timing of the pulse signal,
a slope absolute value output unit that outputs an absolute value of the slope of the frequency shift of the modulation waveform,
a slope output unit that outputs the slope obtained by multiplying the frequency shift direction information by the absolute value,
a frequency shift calculation unit that calculates a value obtained by multiplying the slope output from the slope output unit by a predetermined clock cycle as a frequency shift for each predetermined clock cycle, and
a cumulative addition circuit that generates the modulation waveform by cumulatively adding the frequency shift calculated by the frequency shift calculation unit for each predetermined clock cycle, and
wherein the modulation control unit controls the absolute value output from the slope absolute value output unit.

3. The spread spectrum clock generator according to claim 2, wherein the cumulative addition circuit resets a head value of the modulation waveform for each cycle at the timing of the pulse signal to a predetermined value.

4. A pulse pattern generator wherein the pulse pattern generator generates a pulse pattern signal by using the spread spectrum clock signal generated by the spread spectrum clock generator according to claim 1.

5. An error rate measuring device comprising:
the pulse pattern generator according to claim 4; and
an error rate calculation unit that calculates an error rate of a signal under measurement output from a device under test in response to an input of a test signal for testing the device under test, by comparing the signal under measurement with the test signal, wherein
the test signal is the pulse pattern signal generated by the pulse pattern generator.

6. A spread spectrum clock generation method comprising:
a reference signal generation step of generating a reference signal;
a modulation waveform generation step of generating a modulation waveform;
a modulation step of frequency-modulating the reference signal with the modulation waveform to generate a spread spectrum clock signal having a frequency shift and a slope of the frequency shift; and
a modulation control step of arbitrarily controlling the frequency shift of the modulation waveform and the slope of the frequency shift in a time section.

7. The spread spectrum clock generation method according to claim 6, wherein the modulation waveform generation step comprises:
a pulse signal output step of outputting a pulse signal every 1/4 cycle of the modulation waveform,
a frequency shift direction information output step of outputting frequency shift direction information indicating whether the slope of the frequency shift of the modulation waveform is positive or negative at a timing of the pulse signal, a slope absolute value output step of outputting an absolute value of the slope of the frequency shift of the modulation waveform, a slope output step of outputting the slope obtained by multiplying the frequency shift direction information by the absolute value, a frequency shift calculation step of calculating a value obtained by multiplying the slope output from the slope output step by a predetermined clock cycle as a frequency shift for each predetermined clock cycle, and a cumulative addition step of generating the modulation waveform by cumulatively adding the frequency shift calculated in the frequency shift calculation step for each predetermined clock cycle, and wherein in the modulation control step, the absolute value output from the slope absolute value output step is controlled.

8. The spread spectrum clock generation method according to claim 7, wherein in the cumulative addition step, a head value of the modulation waveform for each cycle at the timing of the pulse signal is reset to a predetermined value.

9. A pulse pattern generation method comprising:

a step of generating a pulse pattern signal by using the spread spectrum clock signal generated by the spread spectrum clock generation method according to claim 6.

10. An error rate measuring method comprising:

the pulse pattern generation method according to claim 9; and an error rate calculation step of calculating an error rate of a signal under measurement output from a device under test in response to an input of a test signal for testing the device under test, by comparing the signal under measurement with the test signal, wherein the test signal is the pulse pattern signal generated by the pulse pattern generation method.

\* \* \* \* \*